(12) United States Patent
Yonemori

(10) Patent No.: US 10,609,820 B2
(45) Date of Patent: Mar. 31, 2020

(54) ELECTRONIC COMPONENT MODULE, DC-DC CONVERTER, AND ELECTRONIC DEVICE

(71) Applicant: Murata Manufacturing Co., Ltd., Nagaokakyo-shi, Kyoto-fu (JP)

(72) Inventor: Keito Yonemori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 48 days.

(21) Appl. No.: 16/027,404

(22) Filed: Jul. 5, 2018

(65) Prior Publication Data

US 2018/0317324 A1 Nov. 1, 2018

Related U.S. Application Data

(63) Continuation of application No. PCT/JP2017/008117, filed on Mar. 1, 2017.

(30) Foreign Application Priority Data

Mar. 2, 2016 (JP) ................................. 2016-040354

(51) Int. Cl.
*H05K 1/18* (2006.01)
*H02M 3/155* (2006.01)
(Continued)

(52) U.S. Cl.
CPC ............ *H05K 1/189* (2013.01); *H02M 3/155* (2013.01); *H05K 1/111* (2013.01); *H05K 1/144* (2013.01);
(Continued)

(58) Field of Classification Search
CPC ........ H05K 1/189; H05K 1/111; H05K 1/144; H05K 1/147; H05K 1/165; H05K 1/181; H05K 1/028; H05K 1/114; H05K 1/142; H05K 2201/042; H05K 2201/10015; H05K 2201/10037; H05K 2201/10166; H05K 2201/10522; H05K 2201/10734; H02M 3/155

See application file for complete search history.

(56) References Cited

U.S. PATENT DOCUMENTS 9,723,713 B1 * 8/2017 Vrtis ..................... H05K 1/0281
2009/0201005 A1 8/2009 Noma et al.
(Continued)

FOREIGN PATENT DOCUMENTS

JP 57-197614 U 12/1982
JP 2004-111563 A 4/2004
(Continued)

OTHER PUBLICATIONS

Official Communication issued in Japanese Patent Application No. 2018-503370, dated Jul. 30, 2019.
(Continued)

*Primary Examiner* — Steven T Sawyer
(74) *Attorney, Agent, or Firm* — Keating & Bennett, LLP

(57) ABSTRACT

An electronic component module includes a substrate, a coil element provided in or on the substrate, and an IC element connected to the coil element, in which external terminals are provided on the substrate, the substrate includes a first region and a second region different region from the first region when the substrate is viewed in plan view, the IC element is provided in the first region, the external terminals are provided at least in the first region, the coil element extends across the first region and the second region, and the first region is a rigid region and the second region is more flexible than the first region.

20 Claims, 11 Drawing Sheets

(51) Int. Cl.
*H05K 1/11* (2006.01)
*H05K 1/14* (2006.01)
*H05K 1/16* (2006.01)
*H05K 1/02* (2006.01)

(52) U.S. Cl.
CPC ............ *H05K 1/147* (2013.01); *H05K 1/165* (2013.01); *H05K 1/181* (2013.01); H05K 1/028 (2013.01); H05K 1/114 (2013.01); H05K 1/142 (2013.01); H05K 2201/042 (2013.01); H05K 2201/10015 (2013.01); H05K 2201/10037 (2013.01); H05K 2201/10166 (2013.01); H05K 2201/10522 (2013.01); H05K 2201/10734 (2013.01)

(56) References Cited

U.S. PATENT DOCUMENTS

| | | |
|---|---|---|
| 2010/0164670 A1 | 7/2010 | Nakahori et al. |
| 2012/0056796 A1 | 3/2012 | Kato et al. |
| 2013/0112754 A1* | 5/2013 | Ikemoto ............. G06K 7/10336 235/488 |
| 2016/0014893 A1* | 1/2016 | Yosui ................... H05K 3/4691 174/254 |
| 2016/0014903 A1* | 1/2016 | Kato ...................... H05K 1/162 361/749 |

FOREIGN PATENT DOCUMENTS

| | | |
|---|---|---|
| JP | 2010-153724 A | 7/2010 |
| JP | 2013-131642 A | 7/2013 |
| JP | 2014-135389 A | 7/2014 |
| WO | 2008/087781 A1 | 7/2008 |
| WO | 2010/131524 A1 | 11/2010 |

OTHER PUBLICATIONS

Official Communication issued in International Patent Application No. PCT/JP2017/008117, dated May 23, 2017.

* cited by examiner

FIG. 4
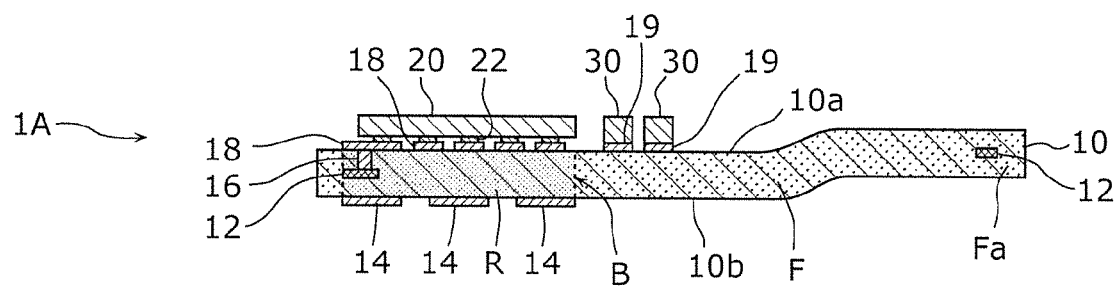
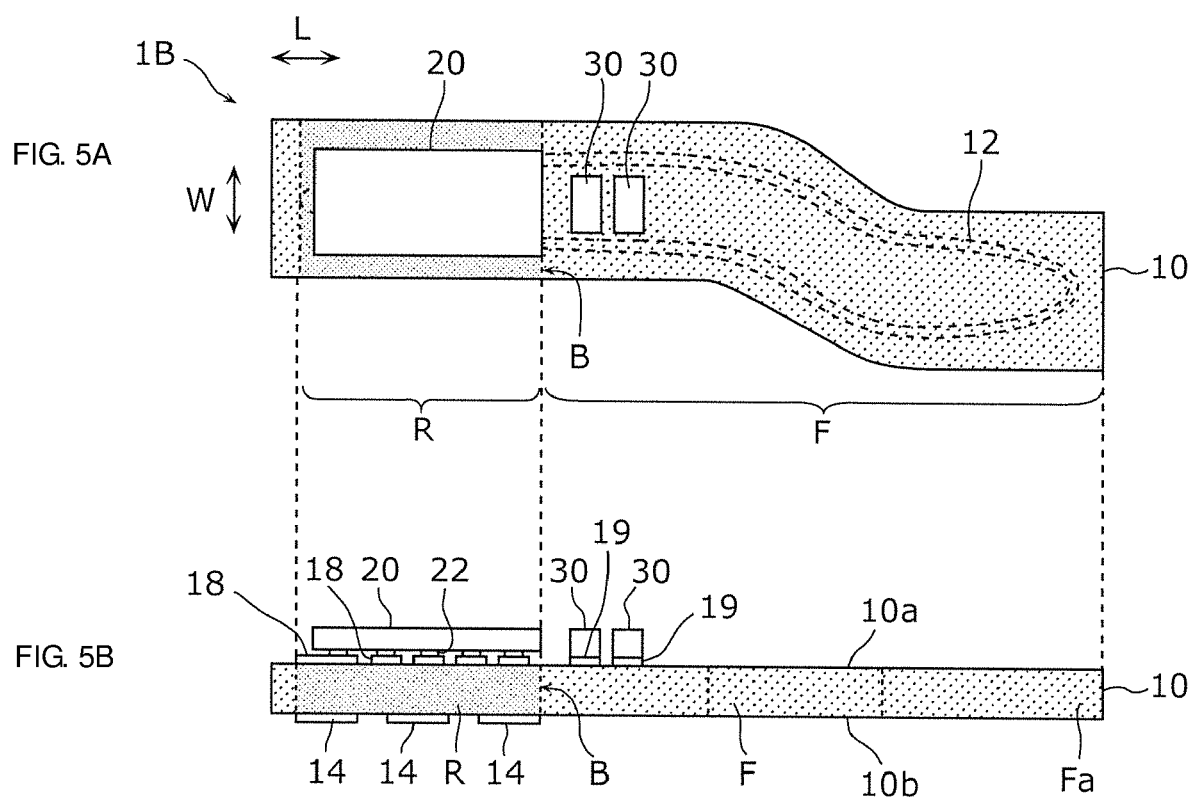
FIG. 5A
FIG. 5B

FIG. 6A
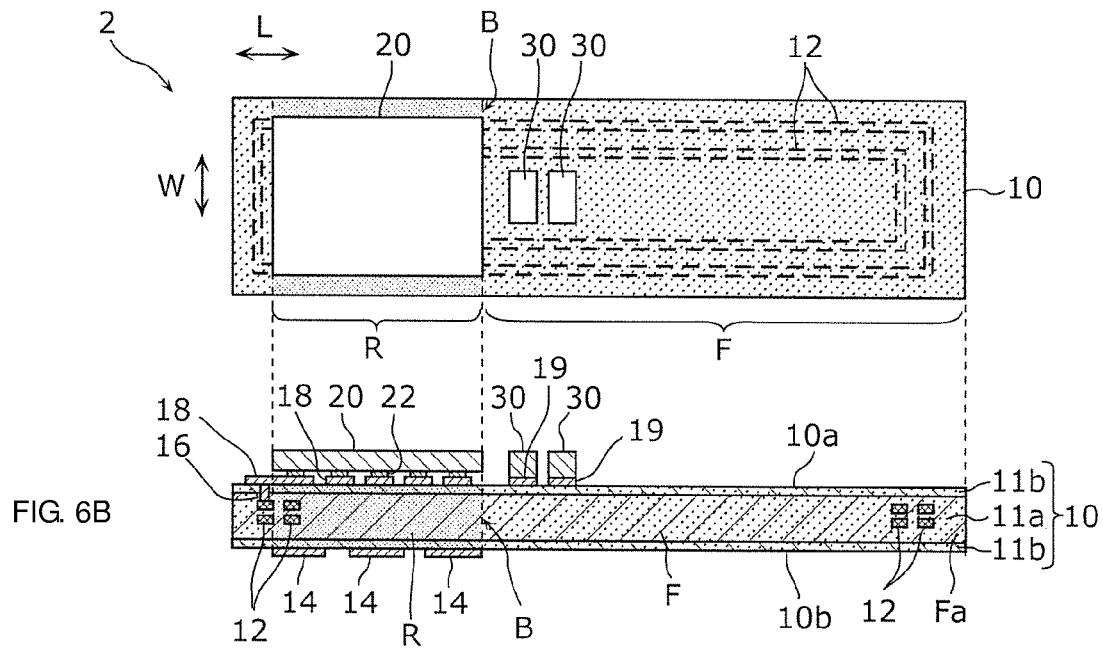
FIG. 6B
FIG. 7A
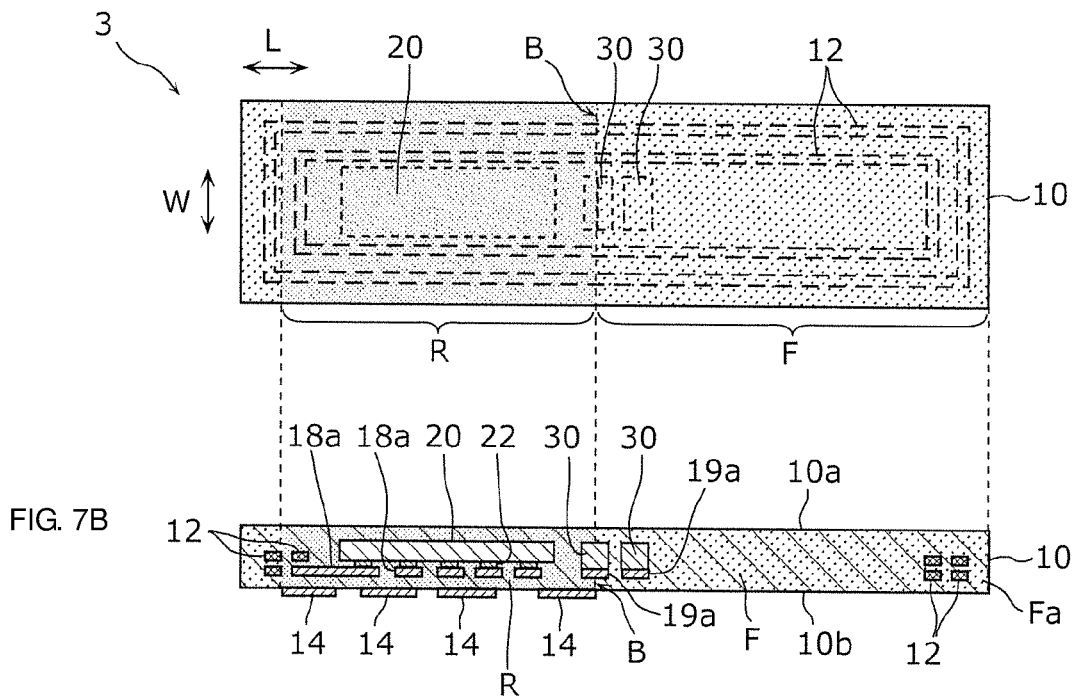
FIG. 7B

ELECTRONIC COMPONENT MODULE, DC-DC CONVERTER, AND ELECTRONIC DEVICE

CROSS REFERENCE TO RELATED APPLICATIONS

This application claims the benefit of priority to Japanese Patent Application No. 2016-040354 filed on Mar. 2, 2016 and is a Continuation Application of PCT Application No. PCT/JP2017/008117 filed on Mar. 1, 2017. The entire contents of each application are hereby incorporated herein by reference.

BACKGROUND OF THE INVENTION

1. Field of the Invention

The present invention relates to an electronic component module including a coil element and an IC element, a DC-DC converter including the electronic component module, and an electronic device including the electronic component module or the DC-DC converter.

2. Description of the Related Art

An electronic component module is known which includes a coil element provided in a substrate and an IC element mounted on one main surface of the substrate and connected to the coil element.

As an example of such an electronic component module, International Publication No. 2008/087781 discloses a DC-DC converter in which a coil is incorporated in a multilayer substrate formed by laminating a plurality of magnetic material layers, and a surface mount device, such as a switching IC element and a chip capacitor, etc. is mounted on one main surface of the multilayer substrate.

However, in the electronic component module disclosed in International Publication No. 2008/087781, only a coil having relatively small dimensions of an internal diameter and an external diameter may be formed. There has been a problem that an area in which an electronic component module is mounted is limited in a small electronic device, such as a personal digital assistant and a wearable terminal, etc. because an area of a multilayer substrate is required to be increased when a coil having large dimensions of an internal diameter and an external diameter is to be incorporated.

SUMMARY OF THE INVENTION

Preferred embodiments of the present invention provide electronic component modules each of which is capable of reducing a limitation on a mounting location when an electronic component module is mounted inside an electronic device.

An electronic component module according to a preferred embodiment of the present invention includes a substrate, a coil element provided in or on the substrate, and an IC element connected to the coil element, in which a plurality of external terminals are provided on the substrate, the substrate includes a first region and a second region different from the first region when the substrate is viewed in plan view, the IC element is provided in the first region, the plurality of external terminals are provided at least in the first region, the coil element extends across the first region and the second region, and the first region is a rigid region and the second region is more flexible than the first region.

As described above, since the first region of the substrate is a rigid region and the second region is a flexible region, even when components of an electronic device are provided around the first region, for example, arrangement of those components is able to be avoided in the second region and the electronic component module is able to be mounted at a desired position in the electronic device. Accordingly, it is possible to reduce the limitations on a mounting location when the electronic component module is mounted inside the electronic device.

Further, since the coil element extends across the first region and the second region, a circumferential length of the coil is increased, and the number of turns in an axial direction of the coil is able to be reduced as compared to a case in which the coil element is provided only in the first region. Thus, it is possible to reduce a height of the electronic component module and to mount the electronic component module even in a small space in the electronic device. Accordingly, it is possible to reduce the limitations on the mounting location when the electronic component module is mounted inside the electronic device.

In addition, in the electronic component module, when the substrate is viewed in plan view, a dimension of the substrate in a length direction may be equal to or larger than a dimension of the substrate in a width direction perpendicular or substantially perpendicular to the length direction, and the first region and the second region may be adjacent to each other in the length direction.

According to this configuration, it is possible to reduce the limitations on a mounting location of the electronic component module in the length direction when the electronic component module is mounted inside the electronic device.

In addition, a proportion of the coil element to the second region may be larger than a proportion of the coil element to the first region.

According to this configuration, a circumferential length of the coil element occupying the large proportion in the second region is increased, and the number of turns in the axial direction of the coil is able to be reduced as compared to a case in which the coil element is provided only in the first region. Thus, the height of the electronic component module is able to be further reduced.

In addition, the first region may be bonded to a circuit board different from the substrate including the plurality of external terminals interposed therebetween, and an end portion of the second region of both ends of the substrate may be a free end.

As described above, since the first region of the substrate is fixed to the circuit board and the second region is the flexible region having the free end, even when components other than the electronic component module are provided around the first region, those components are avoided in the second region and the electronic component module is able to be mounted to a desired position of the circuit board. Thus, it is possible to reduce the limitations on a mounting location when the electronic component module is mounted on the circuit board.

In addition, at least a portion of the second region may have a curved shape.

In this way, by making the second region curved, even when components other than the electronic component module are provided around the first region, it is possible to bypass the components in the second region and reduce stress applied to the second region. Thus, damage to the electronic component module is able to be reduced or prevented.

Further, a plurality of surface mount passive components, such as a capacitor, may be provided on the substrate, and the plurality of passive components may be provided in a vicinity of a boundary between the first region and the second region.

According to this configuration, even when an external force is applied to the second region and the second region is bent, for example, bending stress is reduced in the vicinity of the boundary, and the bending stress is not significantly applied directly to the first region. As a result, it is possible to reduce or prevent damage to a mounted component, such as an IC element provided in the first region, or damage to a joint portion of the IC element and the substrate.

Further, a plurality of first surface electrodes that connect the IC element and a plurality of second surface electrodes that connect the plurality of passive components may be provided on a surface opposite to a surface on which the plurality of external terminals are provided on the substrate, the plurality of first surface electrodes may be provided in the first region of the substrate, the plurality of second surface electrodes may be provided at least in the second region of the substrate, and a proportion of an area of the first surface electrode to the first region may be larger than a proportion of an area of the second surface electrode to the second region.

According to this configuration, since the first region in which a large proportion is occupied by the surface electrodes is a rigid region and the second region in which a small proportion is occupied by the surface electrodes is a flexible region, even when components of an electronic device are disposed around the first region, those components are able to be avoided in the second region and the electronic component module is able to be mounted at a desired position in the electronic device. Accordingly, it is possible to reduce the limitations on the mounting location when the electronic component module is mounted inside the electronic device.

Further, a DC-DC converter according to a preferred embodiment of the present invention may be defined by an electronic component module according to a preferred embodiment of the present invention. In other words, the DC-DC converter is defined by an electronic component module including a substrate, a coil element provided in the substrate, and an IC element connected to the coil element, in which a plurality of external terminals are provided on the substrate, the substrate includes a first region and a second region different from the first region when the substrate is viewed in plan view, the IC element is provided in the first region, the plurality of external terminals are provided at least in the first region, the coil element extends across the first region and the second region, and the first region is a rigid region and the second region is more flexible than the first region.

According to this configuration, it is possible to reduce the limitations on a mounting location when the DC-DC converter is mounted inside the electronic device.

Additionally, an electronic device according to a preferred embodiment of the present invention includes an electronic component module including a substrate, a coil element provided in the substrate, and an IC element connected to the coil element; a circuit board to mount the electronic component module; and a housing to house the electronic component module and the circuit board, in which a plurality of external terminals are provided on the substrate of the electronic component module, the substrate includes a first region and a second region different from the first region when the substrate is viewed in plan view, the IC element is provided in the first region, the plurality of external terminals are provided at least in the first region, the coil element extends across the first region and the second region, and the first region is a rigid region and the second region is a region more flexible than the first region. The first region of the substrate of the electronic component module is fixed on the circuit board, and the second region of the substrate is housed in the housing in a state of being bent.

As described above, since the second region of the substrate of the electronic component module is housed in the housing in the state of being bent, it is possible to reduce the limitations on the mounting location when the electronic component module is mounted inside the electronic device. Further, since the limitations on the mounting location are reduced, it is possible to effectively use a space in the housing of the electronic device.

According to preferred embodiments of the present invention, it is possible to reduce limitations on a mounting location when an electronic component module is mounted inside an electronic device.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a plan view, FIG. 1B is a cross-sectional view when viewed from a front side, and FIG. 1C is a bottom view.

FIG. 4 is a cross-sectional view of an electronic component module according to a first modification of the first preferred embodiment of the present invention when viewed from a front side.

FIGS. 5A and 5B are diagrams illustrating an electronic component module according to a second modification of the first preferred embodiment of the present invention, FIG. 5A is a plan view and FIG. 5B is a front view.

FIGS. 6A and 6B are diagrams illustrating an electronic component module according to a second preferred embodiment of the present invention.

FIGS. 7A and 7B are diagrams illustrating an electronic component module according to a third preferred embodiment of the present invention.

FIG. 13A is a plan view, and FIG. 13B is a cross-sectional view when viewed from a front side.

DETAILED DESCRIPTION OF THE PREFERRED EMBODIMENTS

Figure 1A:
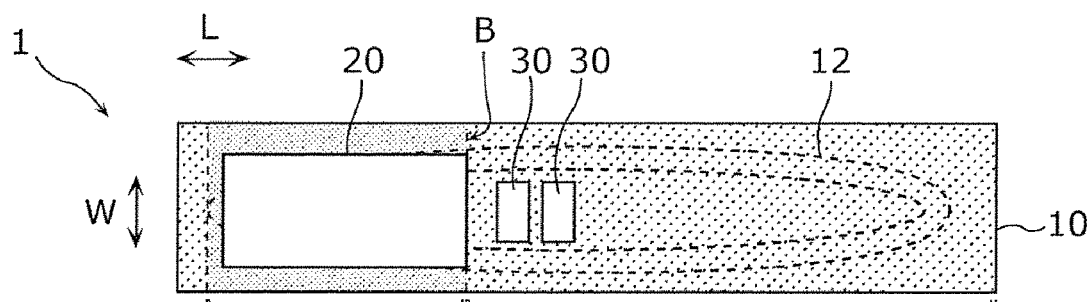
FIGS. 1A to 1C are diagrams illustrating an electronic component module according to a first preferred embodiment of the present invention.

Hereinafter, preferred embodiments of the present invention will be described in detail with reference to the drawings. In addition, each of the preferred embodiments described below represents a comprehensive or specific example. Numerical values, shapes, materials, elements, arrangements and connections of the elements, manufacturing processes, and an order of manufacturing processes shown in the following preferred embodiments are merely examples and are not intended to limit the present invention. Among elements in the following preferred embodiments, elements that are not described in independent claims will be described as optional elements.

In addition, each of the drawings is a schematic diagram, and sizes or ratios of the sizes of elements illustrated in the drawings are not necessarily strict. In addition, in each of the drawings, identical reference signs are assigned to identical or substantially identical configurations, and redundant descriptions thereof will be omitted or simplified. In addition, in the following preferred embodiments, a term "connected" means not only a case of being directly connected but also a case of being electrically connected with another element or other component interposed therebetween.

First Preferred Embodiment

An electronic component module according to a first preferred embodiment of the present invention includes a coil element, an IC element, and a surface mount passive component (e.g., a capacitor). The coil element in the electronic component module defines and functions as, for example, a power inductor, an antenna, or a magnetic field sensor. In the present preferred embodiment, a DC-DC converter in which a coil element defines and functions as a power inductor will be described as an example.

Figure 1B:
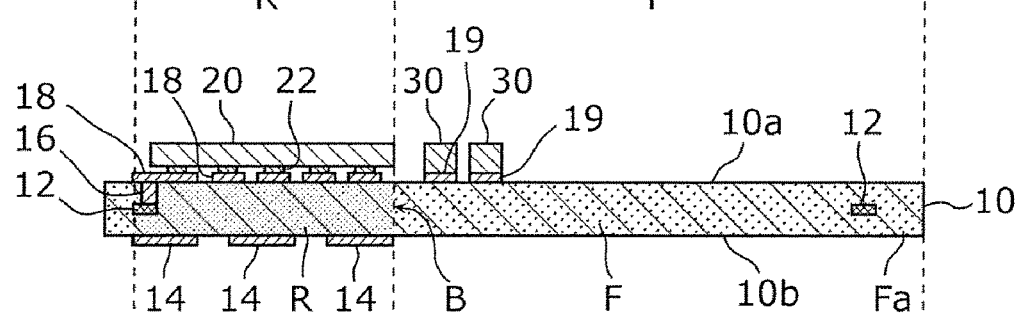
Figure 1C:
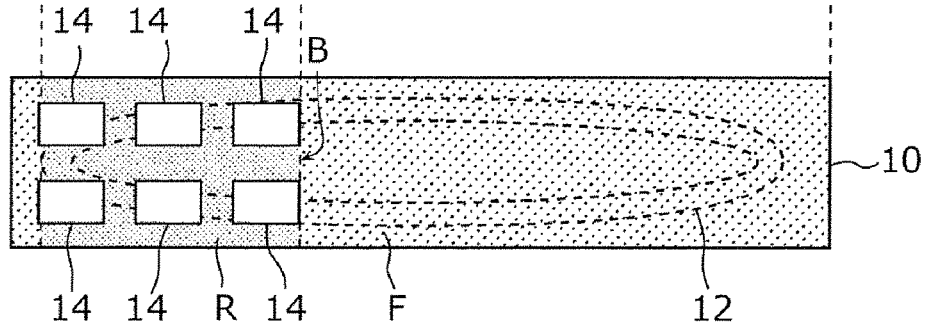

FIGS. 1A to 1C are diagrams illustrating an electronic component module 1 according to the present preferred embodiment.

As illustrated in FIGS. 1A to 1C, the electronic component module 1 includes a substrate 10, a coil element 12 provided on the substrate 10, and an IC element 20 connected to the coil element 12. Further, the electronic component module 1 includes a plurality of capacitors 30. Further, a plurality of external terminals 14 are provided on the substrate 10.

Figure 2:
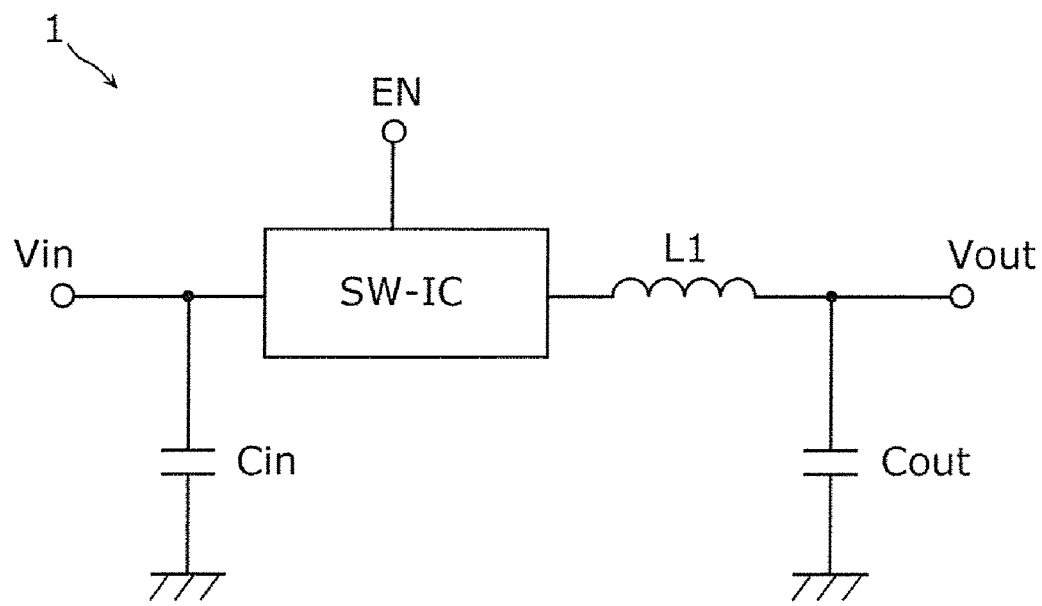
FIG. 2 is a circuit diagram illustrating an example of the electronic component module according to the first preferred embodiment of the present invention.

FIG. 2 is a circuit diagram illustrating an example of the electronic component module 1 according to the present preferred embodiment.

As illustrated in FIG. 2, an input terminal of an SW-IC (IC element 20) is connected to an external terminal Vin (external terminal 14) on an input side of the electronic component module 1, and an output terminal of the SW-IC is connected to an external terminal Vout (external terminal 14) on an output side of the electronic component module 1 with a coil L1 (coil element 12) interposed therebetween. An enable terminal of the SW-IC is connected to an enable terminal EN of the electronic component module 1. An end of a capacitor Cin (capacitor 30) on the input side is connected between the external terminal Vin and the input terminal of the SW-IC, and the other end is connected to the ground. Further, an end of a capacitor Cout (capacitor 30) on an output side is connected between the coil L1 and the external terminal Vout, and the other end is connected to the ground.

The SW-IC preferably includes, for example, two switch elements, such as a field effect transistor, and a controller exclusively (alternately) switching conducting or non-conducting of the two switch elements (not illustrated). Additionally, the electronic component module 1 is switches an input voltage supplied to the external terminal Vin at a predetermined frequency using the two switch elements, smoothes the input voltage by the coil L1 and the capacitor Cout, converts the input voltage into a desired output voltage, and outputs the desired output voltage from the external terminal Vout.

The SW-IC, the coil L1, the capacitors Cin, Cout, and the external terminals Vin, Vout are provided on the substrate 10 so as to have the above connection relationship.

Hereinafter, the configuration of the electronic component module 1 illustrated in FIGS. 1A to 1C will be described.

As illustrated in FIG. 1A, the substrate 10 has a rectangular or substantially rectangular shape when viewed in plan view, and a dimension of the substrate 10 in a length direction L is equal to or larger than a dimension of the substrate 10 in a width direction W which is a direction perpendicular or substantially perpendicular to the length direction L. The substrate 10 is preferably, for example, a multilayer substrate formed by laminating and pressure-bonding a plurality of resin base materials. As a material of the resin base material, a thermoplastic resin sheet, such as a liquid crystal polymer (LCP) or a polyimide is preferably used, for example. The substrate 10 is a non-magnetic body, and the resin base material defining the substrate 10 has flexibility.

As illustrated in FIG. 1B, a plurality of first surface electrodes 18 connected to the IC element 20 and a plurality of second surface electrodes 19 connected to a plurality of passive components (e.g., capacitor 30) are provided on one main surface 10a of the substrate 10. Further, a plurality of external terminals 14 are provided on the other main surface 10b which is a surface opposite to the one main surface 10a of the substrate 10. The external terminal 14 is a terminal to mount the electronic component module 1 on a circuit board, such as a printed circuit board, and includes a terminal to input a DC voltage, a terminal to output a DC voltage, a ground terminal connected to a ground of the circuit board, and other suitable terminals.

As a material of the first surface electrode 18, the second surface electrode 19, and the external terminal 14, for example, a metal foil including copper as a main component is preferably used. The first surface electrode 18, the second surface electrode 19, and the external terminal 14 each have a material property (Young's modulus) harder than a resin base material from which the substrate 10 is made. The first surface electrode 18, the second surface electrode 19, and the external terminal 14 may preferably be plated with nickel, palladium, or gold, for example. By the plating, hardness may be further increased.

In addition, a via conductor 16 and a lead wire conductor electrically connecting each of the elements are provided inside the substrate 10 (not illustrated in detail). The via conductor is preferably made of, for example, a metal sintered body including tin as a main component, and the lead wire conductor is preferably made of, for example, a metal foil including copper as a main component.

When the substrate 10 is viewed in plan view (when viewed from a thickness direction), the substrate 10 includes a first region R and a second region F that is a different region from the first region R. The first region R is defined in a predetermined portion in which the plurality of external terminals 14 are provided. For example, in the length direction L, the first region R is a region sandwiched between an outermost edge of the external terminal 14 located at one end side of the plurality of external terminals 14 and an outermost edge of the external terminal 14 located at an opposite side of the one end. Note that the external terminal 14 is not provided in the second region F. Also, the via conductor and the lead wire conductor described above are provided in the first region R.

The first region R and the second region F of the substrate 10 are adjacent to each other in the length direction L. In addition, in the length direction L, a dimension of the second region F is larger than a dimension of the first region R, and the first region R and the second region F have the same or substantially the same dimension in the width direction W. Further, the first region R and the second region F of the substrate 10 are preferably made of the same resin base material.

In the present preferred embodiment, the plurality of external terminals 14 are provided in the first region R. With this structure, the first region R is a rigid region (region hard to bend), and the second region F is a flexible region more flexible than the first region R (region easy to bend). Accordingly, when an external force is applied to the second region F of the substrate 10, the second region F may be easily bent. In addition, of both ends of the substrate 10 in the longitudinal direction (the length direction) L, an end portion Fa of the second region F is a free end.

Further, the plurality of first surface electrodes 18 are provided in the first region R, and the plurality of second surface electrodes 19 are provided in the second region F. When the substrate 10 is viewed in plan view, a proportion of an area occupied by the first surface electrodes 18 in the entire first region R is larger than a proportion of an area occupied by the second surface electrodes 19 in the entire second region F. Thus, the first region R having the larger proportion occupied by the surface electrodes is more rigid than the second region F. Further, since main portions, such as the via conductor and the lead wire conductor, are also provided in the first region R, a conductor density of the first region R is larger than a conductor density of the second region F. In other words, as physical properties of the entire substrate 10 including the base material and the various conductors, the first region R is a region which is harder than the second region F and has a larger Young's modulus. In other words, a region having a higher conductor density is a rigid region and a region having a lower conductor density is a flexible region.

The IC element 20 is preferably a semiconductor integrated circuit element in which various circuits are provided on a semiconductor substrate, such as silicon, and is molded using an epoxy resin or other suitable material, and has a material property harder than the resin base material from which the substrate 10 is made. The IC element 20 is electrically and mechanically bonded to the substrate 10 with a conductive bonding agent 22, such as solder, for example, and the first surface electrode 18 interposed therebetween. In other words, the IC element 20 is bonded to the first region R of the substrate 10. Since the IC element 20 having the hard property is bonded to the first region R of the substrate 10, the first region R is more rigid than the second region F as the electronic component module 1.

The coil element 12 is provided inside the substrate 10. As the coil element 12, for example, a flexible metal foil including copper as a main component is preferably used. Further, for example, the coil element is defined by a conductor pattern having one layer, one turn and a loop shape in which a coil axis is oriented in the thickness direction of the substrate 10. One end of the coil element 12 is connected to an output terminal on an input side of the IC element 20 with the via conductor 16 in the substrate 10 interposed therebetween, and the other end of the coil element 12 is connected to the external terminal 14 on an output side with another via conductor (not illustrated) in the substrate 10 interposed therebetween. Note that the one end of the coil element 12 may be connected to an input terminal of the IC element 20, and the other end of the coil element 12 may be connected to the external terminal 14 on the input side.

In the present preferred embodiment, when the substrate 10 is viewed in plan view, the coil element 12 extends across the first region R and the second region F. Since the coil element 12 is provided in the first region R and the second region F, a circumferential length of the coil is increased, and an inductance value is able to be increased accordingly. Thus, as compared to a case in which a coil element is provided in only the first region R, the number of turns in an axial direction of the coil is able to be reduced. Thus, a thickness of the substrate 10 is able to be reduced, and a height of the electronic component module 1 is able to be reduced. Further, by thickening (increasing) a line width of the coil, it is also possible to reduce loss in the coil element.

In addition, a proportion occupied by the coil element 12 in the second region F is larger than a proportion occupied by the coil element 12 in the first region R. That is, in the coil element 12, a portion provided in the second region F is larger than a portion provided in the first region R. With this structure, it is possible to further reduce the number of turns of the coil as compared to the case in which the coil element is provided in only the first region R. Thus, the thickness of the substrate 10 is able to be reduced, and the height of the electronic component module 1 is able to be further reduced. Further, by thickening (increasing) a line width of the coil, it is also possible to reduce loss in the coil element.

A surface mount passive component is preferably a capacitor 30 which is made of ceramic, for example. The capacitor 30 is, for example, a ceramic capacitor having a rectangular or substantially rectangular parallelepiped shape and is bonded to the substrate 10 with a bonding agent (not illustrated) and the second surface electrode 19 interposed therebetween. In other words, the plurality of capacitors 30 are bonded to the second region F of the substrate 10. Further, each of the capacitors 30 is disposed so that a long side thereof is parallel or substantially parallel to the width direction W of the substrate 10 and is bonded thereto. Note that the passive component is not limited to a capacitor, and may be an inductor or a resistor, for example.

Further, the plurality of capacitors 30 are not provided on the end portion Fa side of the second region F but are provided in a vicinity of a boundary B between the first region R and the second region F. Although the vicinity of the boundary B provided with the plurality of capacitors 30 is in the flexible region, because of rigidity of the second surface electrode 19 and the capacitor 30, the vicinity is a region having rigidity between the rigid region and the flexible region. Thus, even when an external force is applied to the second region F and the second region F is bent, for example, bending stress is reduced in the vicinity of the boundary B, and the bending stress is not significantly applied directly to the first region R and the IC element 20 in this configuration.

Next, a non-limiting example of a method for manufacturing the electronic component module 1 according to a preferred embodiment of the present invention will be described.

First, a resin base material and a copper foil are laminated, and then the copper foil is patterned into a desired shape by a photolithography method. Accordingly, a resin base material including the plurality of first surface electrodes 18 and the plurality of second surface electrodes 19, a resin base material including a coil conductor pattern (coil element 12), a plurality of resin base materials including lead wire conductors, and a resin base material including the plurality of external terminals 14 are each formed. The via conductor 16 is formed by providing a through hole in a resin base material, filling a conductive paste including copper, silver, tin, or other suitable material, and curing the conductive paste. In addition, each of the electrodes and the conductors is formed so that, when the resin base materials are laminated and viewed in plan view, the external terminal 14 and the first surface electrode 18 are located in the first region R, the second surface electrode 19 is located in the vicinity of the boundary B between the first region R and the second region F, and the coil conductive pattern extends across the first region R and the second region F.

Thereafter, the plurality of resin base materials described above are laminated, heated, and pressed to form the substrate 10. Then, the IC element 20 is bonded to the plurality of first surface electrodes 18 of the substrate 10 using the bonding agent 22, and each of the plurality of capacitors 30 is bonded to each of the plurality of second surface electrodes 19 using the bonding agent. The electronic component module 1 is manufactured by these steps.

In order to explain the advantageous effects of the electronic component module 1 according to the present preferred embodiment, an example in which the electronic component module 1 is mounted inside a thin electronic device, such as a personal digital assistant, for example, will be described.

Figure 3:
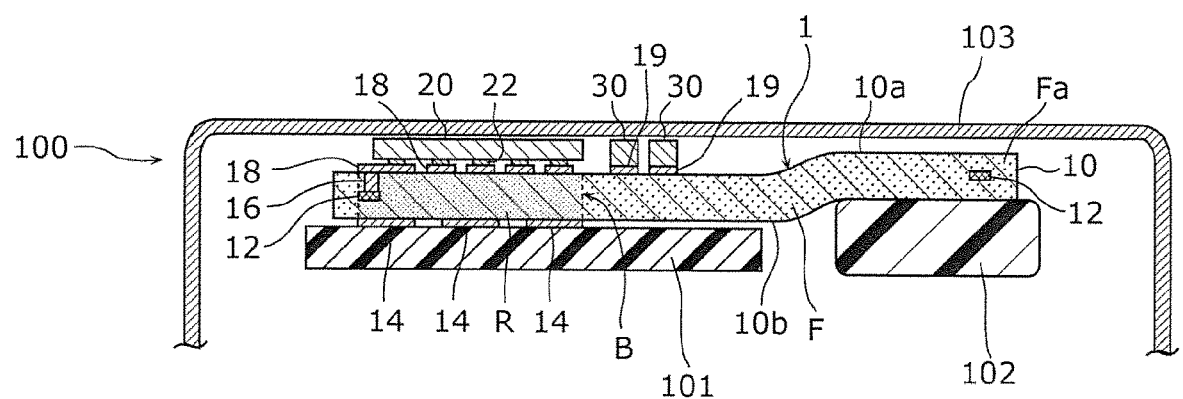
FIG. 3 is a cross-sectional view illustrating a case in which the electronic component module according to the first preferred embodiment of the present invention is mounted inside an electronic device.

FIG. 3 is a diagram illustrating a case in which the electronic component module 1 is mounted inside an electronic device 100. In FIG. 3, a circuit board 101, a battery pack 102, and a housing 103 are illustrated as examples of components included in the electronic device 100. Note that, unlike the substrate 10, the circuit board 101 is a mother board on which the electronic component module 1 is mounted.

As illustrated in FIG. 3, the external terminal 14 of the electronic component module 1 is mounted on the circuit board 101 using a conductive bonding agent, such as solder, for example. Accordingly, the first region R of the substrate 10 is fixed to the circuit board 101, and the rigidity of the first region R is further increased.

On the other hand, the second region F of the substrate 10 is not fixed to the circuit board 101, protrudes to an outer side portion (outer side portion as viewed in the length direction L) of the circuit board 101, receives an external force from the battery pack 102, and is bent in the thickness direction. More specifically, the second region F is bent so as to extend along an outer edge of the battery pack 102 while avoiding the battery pack 102 at the end portion Fa side rather than at a portion provided with the capacitor 30. Thus, the electronic component module 1 is housed in the electronic device 100 in a state in which a portion of the second region F is bent. Note that the second region F may be bent simultaneously during mounting of the electronic component module 1 in the electronic device 100, but may be bent in advance before the electronic component module 1 is mounted in the electronic device 100. In terms of reducing variation in characteristics, it is preferable that the second region F is bent in advance and this state is maintained.

In the electronic component module 1 according to the present preferred embodiment, the first region R of the substrate 10 is the rigid region, and the second region F is the flexible region. Thus, even when the components of the electronic device 100 are disposed around the first region R, these components are able to avoid in the second region F, and the electronic component module 1 is able to be mounted at a desired position on the circuit board 101. Thus, it is possible to reduce limitations on a mounting location when the electronic component module 1 is mounted inside the electronic device 100. Further, since the limitations on the mounting location are reduced, it is possible to effectively and efficiently utilize a space in the housing 103 of the electronic device 100.

Further, in the electronic component module 1, the coil element 12 extends across the first region R and the second region F. As a result, the circumferential length of the coil is increased, and it is possible to reduce the number of turns in the axial direction of the coil as compared to the case in which the coil element is included in only the first region R. Thus, the height of the electronic component module 1 is able to be reduced, and even when a distance between the circuit board 101 and the housing 103 is small, the electronic component module 1 is able be mounted. In particular, in a DC-DC converter module, by increasing dimensions of an inner diameter and an outer diameter of the coil element, it is possible to improve a DC superposition characteristic and to provide an efficient DC-DC converter circuit in a large-current application.

In the present preferred embodiment, in order to make the first region R rigid, the plurality of external terminals 14 are provided and the IC element 20 is provided in the first region R, and the proportion of the area of the surface electrode is increased, but the configuration to make the first region R rigid is not limited thereto. For example, a metal foil electrode other than a surface electrode may be provided in the first region R to increase a proportion of a metal (conductor) that is more rigid than a substrate material, or an insulator that is more rigid than a substrate material, such as a resist pattern or a ferrite sintered body layer, for example, may be provided to reinforce the first region R. In addition, resin molding may be performed for elements other than the external terminal 14 of the first region R.

First Modification of First Preferred Embodiment

In an electronic component module 1A according to a first modification of the first preferred embodiment, the substrate 10 does not extend linearly in the length direction L, but a portion of the second region F has a curved shape.

FIG. 4 is a cross-sectional view of the electronic component module 1A according to the first modification when viewed from a front.

In the substrate 10 of the electronic component module 1A, a portion of the second region F is bent in a thickness direction in advance. This curved structure in the thickness direction may be formed, for example, by performing hot pressing using a mold having a bent shape from the one main surface 10a side of the substrate 10.

In the electronic component module 1A according to the first modification, since the second region F is bent in the thickness direction in advance, even when components other than the electronic component module 1A are disposed around the first region R, for example, these components are able to be bypassed in the second region F and stress applied to the second region F is able to be reduced. Thus, damage to the electronic component module 1A is able to be reduced or prevented. In other words, the second region F may be bent simultaneously during mounting of the electronic component module 1A in the electronic device 100, but may be bent in advance before being mounted in the electronic device 100. In terms of reducing variation in characteristics due to variation in bending amount, it is preferable that the second region F be bent in advance and this state be maintained as in this example.

Second Modification of First Preferred Embodiment

In an electronic component module 1B according to a second modification of the first preferred embodiment, the substrate 10 does not extend linearly in the length direction, but a portion of the second region F has a curved shape when viewed in plan view.

FIGS. 5A and 5B are diagrams illustrating the electronic component module 1B according to the second modification, FIG. 5A is a plan view and FIG. 5B is a front view.

In the substrate 10 of the electronic component module 1B, when the substrate 10 is viewed in plan view, a portion of the second region F is bent in a planar direction. Specifically, the second region F bends toward the width direction W from the boundary B toward the end portion Fa, and then bends toward the length direction L. Also, the coil element 12 is bent and structured in accordance with this bent shape. A structure of the substrate 10 is able to be obtained, for example, by forming a conductor pattern shape formed on a resin base material or a cut shape of a resin base material into a bent shape. In addition, in the substrate 10 according to the second modification, a dimension in the length direction L is equal to or larger than a dimension in the width direction W, and the first region R and the second region F are adjacent to each other in the length direction L.

In the electronic component module 1B according to the second modification, since the second region F is bent in the planar direction in advance, even when components other than the electronic component module 1B are arranged around the first region R, for example, interference with these components is able to be reduced in the second region F, and stress applied to the second region F is able to be reduced. Thus, damage to the electronic component module 1B is able to be reduced or prevented.

Second Preferred Embodiment

In an electronic component module 2 according to a second preferred embodiment of the present invention, the substrate 10 includes a different material layer.

FIGS. 6A and 6B is a diagram illustrating the electronic component module 2 according to the second preferred embodiment.

The substrate 10 of the electronic component module 2 includes a magnetic material layer 11a and two outermost layers 11b each having a lower permeability than the magnetic material layer 11a. For example, the magnetic material layer 11a is preferably a laminated body made of a resin base material including magnetic powder, such as ferrite, dispersed in a resin material. The outermost layer 11b is the same resin base material as in the first preferred embodiment.

The coil element 12 is provided inside the magnetic material layer 11a. Further, the coil element 12 is spiral coil having two turns in two stages in an axial direction of the coil.

In the electronic component module 2 according to the present preferred embodiment, since the coil element 12 is provided inside the magnetic material layer 11a, a magnetic field of the coil element is confined within the substrate and an inductance value is improved. Thus, as compared to a case in which a coil element is provided in only the first region R, the number of turns in the axial direction of the coil is able to be reduced. Thus, a thickness of the substrate 10 is able to be reduced, and a height of the electronic component module 2 is able to be reduced.

On the other hand, in the electronic component module 2, the outermost layer 11b is made of a material having low permeability, rather than being made of a magnetic material. Thus, inductance of a wiring conductor provided on the outermost layer 11b is reduced.

In addition, in the electronic component module 2, the first region R is a rigid region and the second region F is a flexible region. Thus, even when components of the electronic device 100 are disposed around the first region R, arrangement of these components is avoided in the second region F, and the electronic component module 2 is able to be mounted at a desired position on the circuit board 101. Thus, it is possible to reduce limitations on a mounting location when the electronic component module 2 is mounted inside the electronic device 100.

Third Preferred Embodiment

In an electronic component module 3 according to a third preferred embodiment of the present invention, the IC element 20 and the plurality of capacitors 30 are included in the substrate 10.

FIGS. 7A and 7B are diagrams illustrating the electronic component module 3 according to the third preferred embodiment.

In this electronic component module 3, the IC element 20 is included in the first region R of the substrate 10 and is connected to the coil element 12 with an electrode 18a interposed therebetween. The plurality of capacitors 30 are included in the second region F of the substrate 10 and connected to the IC element 20, for example, with an electrode 19a interposed therebetween. In addition, a portion of one capacitor 30 among the plurality of capacitors 30 enters into the first region R. In other words, the plurality of capacitors 30 are provided in a vicinity of the boundary B between the first region R and the second region F.

This electronic component module 3 is formed, for example, by laminating a plurality of resin base materials having notches, inserting the IC element 20 and the plurality of capacitors 30 into the notches, and sandwiching and pressure-bonding a plurality of superposed resin base materials with resin base materials without notches from above and below.

Since the electronic component module 3 according to the present preferred embodiment has a structure in which the IC element 20 and the plurality of capacitors 30 are included in the substrate 10, a thickness of the electronic component module 3 is able to be reduced. Thus, it is possible to reduce limitations on a mounting location when the electronic component module 3 is mounted inside the electronic device 100.

In addition, in the electronic component module 3, the first region R is a rigid region and the second region F is a flexible region. Thus, even when components of the electronic device 100 are disposed around the first region R, arrangement of these components is avoided in the second region F, and the electronic component module 3 is able to be mounted at a desired position on the circuit board 101. Thus, it is possible to reduce the limitations on the mounting location when the electronic component module 3 is mounted inside the electronic device 100.

Fourth Preferred Embodiment

An electronic component module 4 according to a fourth preferred embodiment of the present invention includes a rigid substrate different from the substrate 10 between the IC element 20, the capacitor 30 and the substrate 10.

Figure 8:
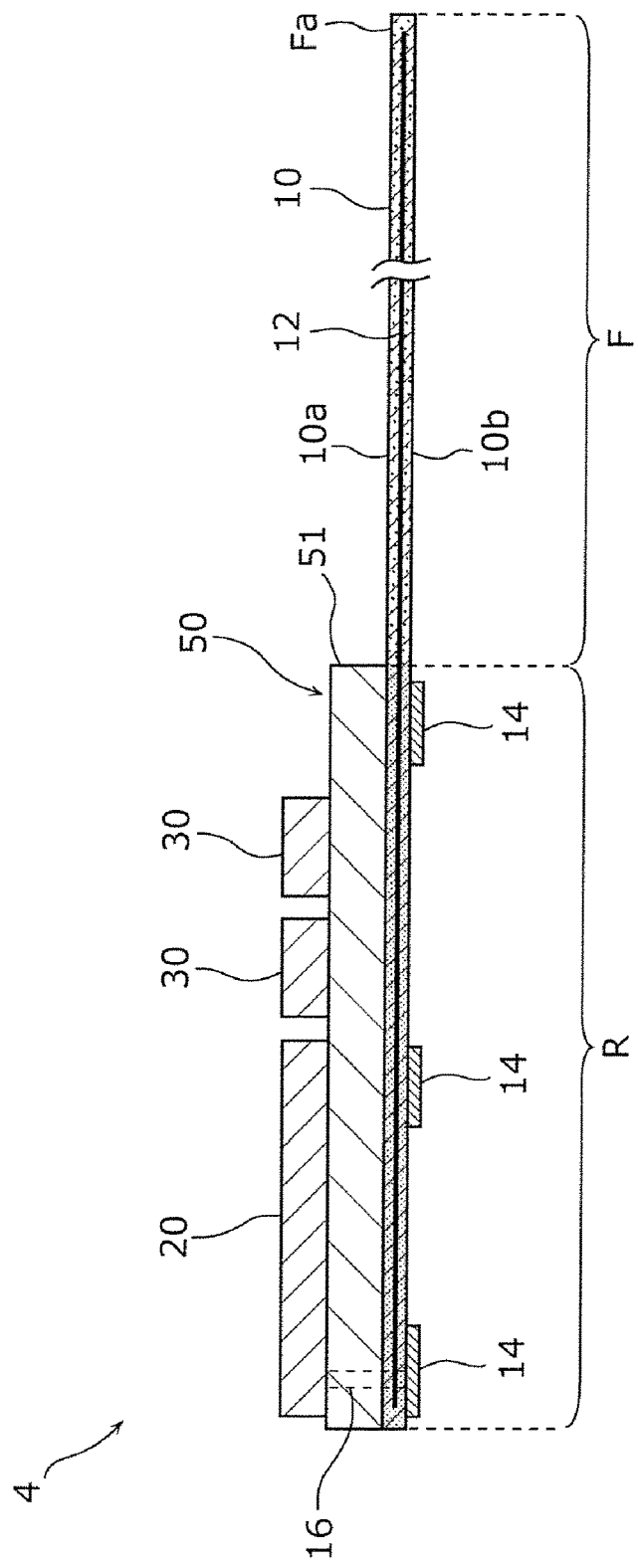
FIG. 8 is a cross-sectional view of an electronic component module according to a fourth preferred embodiment of the present invention in a state before assembly when viewed from a front side.
Figure 9:
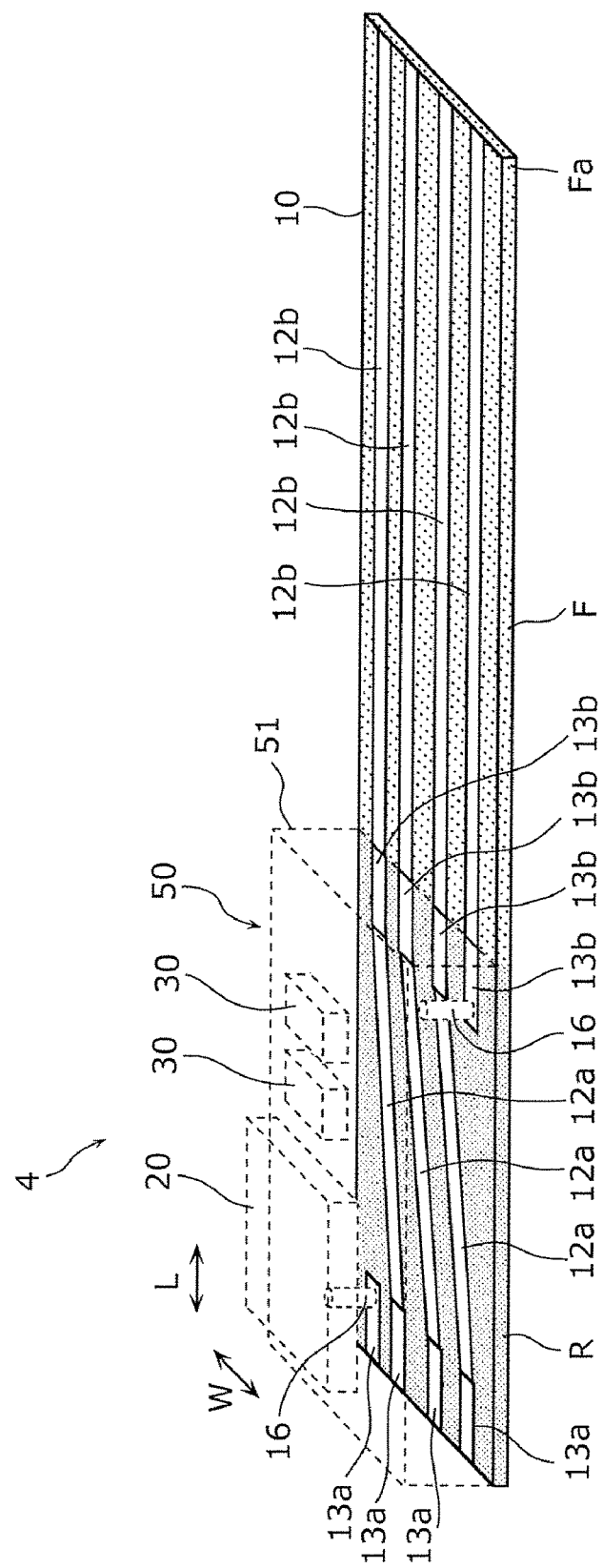
FIG. 9 is a perspective view of the electronic component module according to the fourth preferred embodiment of the present invention in the state before assembly.

FIG. 8 is a cross-sectional view of a state before assembly of the electronic component module 4 when viewed from a front side. FIG. 9 is a perspective view of the state before assembly of the electronic component module 4.

A rigid substrate 51 of the electronic component module 4 is preferably, for example, a resin substrate having rigidity. As illustrated in FIG. 8, the IC element 20 and the plurality of capacitors 30 are mounted on the rigid substrate 51. The rigid substrate 51, the IC element 20, the plurality of capacitors 30, and other elements define a mounted component aggregate 50. The IC element 20 and the plurality of capacitors 30 are connected to the external terminal 14 or the coil element 12 by the via conductor 16 (detailed description thereof is omitted).

In the present preferred embodiment, the first region R of the substrate 10 is in contact with the rigid substrate 51, and the second region F is not in contact with the rigid substrate 51. In the first region R, the IC element 20 and the plurality of capacitors 30 are provided.

As illustrated in FIG. 9, the coil element 12 includes a plurality of longer patterns 12b, a plurality of shorter patterns 12a, and a plurality of pattern connecting electrodes 13a and 13b. Each of the shorter patterns 12a is provided in the first region R of the substrate 10, and is disposed obliquely with respect to the longitudinal direction (the length direction) L of the substrate 10 when viewed in plan view. Each of the longer patterns 12b is provided in the second region F of the substrate 10 and is parallel or substantially parallel to the longitudinal direction (the length direction) L. Each of the pattern connecting electrodes 13a and 13b is provided at both ends of the shorter pattern 12a. The longer pattern 12b may be covered and protected by a resist or other suitable structure.

Figure 10:
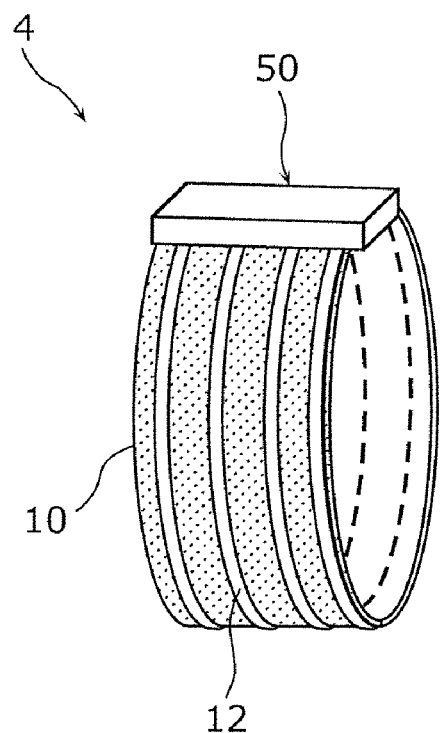
FIG. 10 is a perspective view of the electronic component module according to the fourth preferred embodiment of the present invention in a state of being assembled.

FIG. 10 is a perspective view of the assembled electronic component module 4. In the electronic component module 4, the substrate 10 has a wristband shape, and is used as, for example, a component of a wearable terminal.

As illustrated in FIG. 9 and FIG. 10, the end portion Fa of the second region F is bent and connected to the pattern connecting electrode 13a located on an opposite side, wherein the first region R and the second region F of the substrate 10 have a ring shape. By this connection, the plurality of longer patterns 12b and the plurality of shorter patterns 12a are connected to define the spiral coil element 12. Note that the pattern connecting electrode 13a and the longer pattern 12b may be detachable by using a connector.

In the electronic component module 4 according to the present preferred embodiment, the first region R is a rigid region and the second region F is a flexible region. This makes it possible to use the electronic component module 4 by bending the second region F of the substrate 10 and mounting the module along clothing and the body of a user.

First Modification of Fourth Preferred Embodiment

Figure 11:
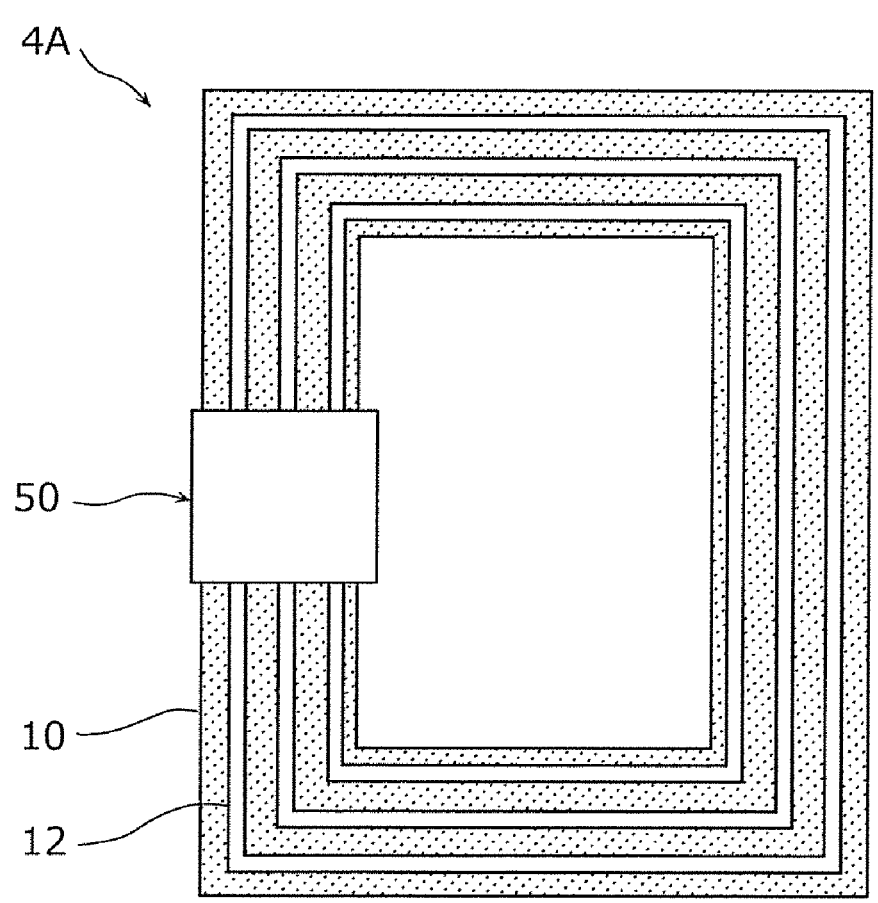
FIG. 11 is a plan view of an electronic component module according to a first modification of the fourth preferred embodiment of the present invention.

FIG. 11 is a plan view of an electronic component module 4A according to a first modification of the fourth preferred embodiment.

In the electronic component module 4A according to the first modification, when viewed in plan view, the second region F of the substrate 10 has a rectangular or substantially rectangular ring shape. The coil element 12 is preferably defined by a spiral coil having three turns in the first region R and the second region F. According to this structure, since a circumferential length of the coil is increased and an inductance value is able to be increased, the number of turns in an axial direction of the coil is able to be reduced. Thus, a height of the electronic component module 4A is able to be reduced.

Second Modification of Fourth Preferred Embodiment

Figure 12:
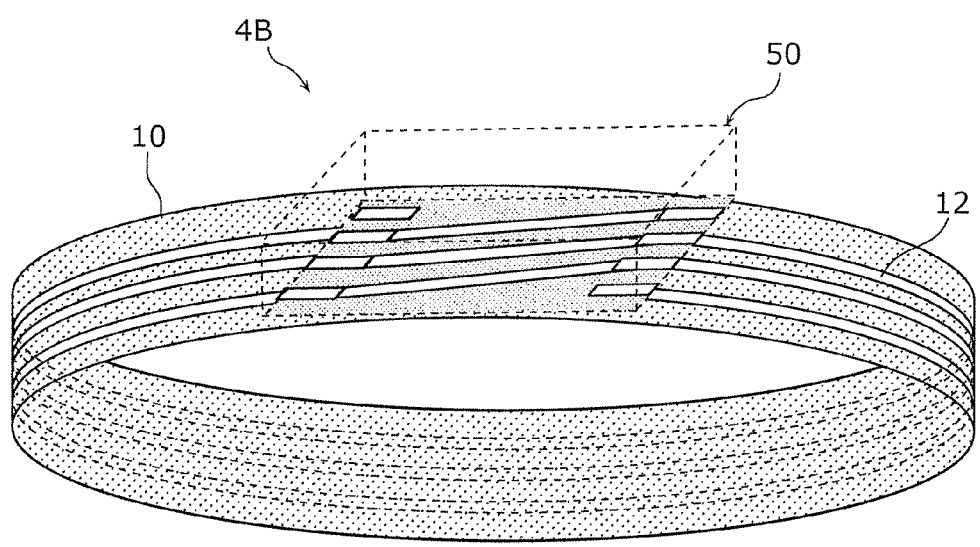
FIG. 12 is a perspective view of an electronic component module according to a second modification of the fourth preferred embodiment of the present invention.

FIG. 12 is a perspective view of an electronic component module 4B according to a second modification of the fourth preferred embodiment.

In the electronic component module 4B, the substrate 10 has a waistband shape, and is used as, for example, a component of a wearable terminal.

In the electronic component module 4B according to the second modification, the second region F of the substrate 10 is disposed vertically or substantially vertically with respect to the mounted component aggregate 50.

In the electronic component module 4B according to the second modification, the first region R is a rigid region and the second region F is a flexible region. This makes it possible to use the electronic component module 4B by bending the second region F of the substrate 10 and mounting the module along clothing and the body of a user.

Fifth Preferred Embodiment

Figure 13:
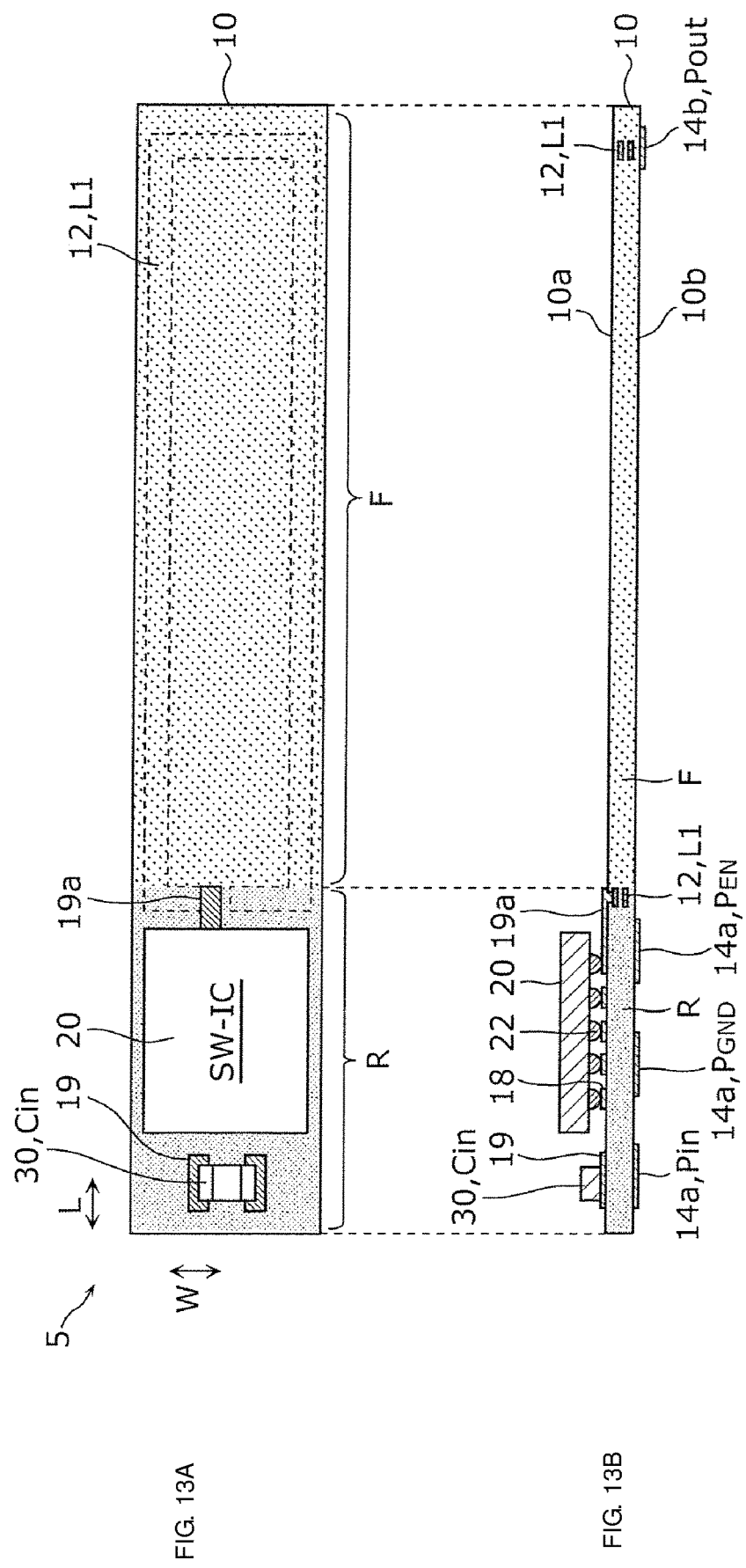
FIGS. 13A and 13B are diagrams illustrating an electronic component module according to a fifth preferred embodiment of the present invention.

FIGS. 13A and 13B are diagrams illustrating an electronic component module 5 according to the present preferred embodiment.

As illustrated in FIGS. 13A and 13B, the electronic component module 5 includes the substrate 10, the coil element 12 provided on the substrate 10, and the IC element 20 connected to the coil element 12. Further, the electronic component module 5 includes the capacitor 30. Further, a plurality of external terminals 14a and 14b are provided on the substrate 10.

Figure 14:
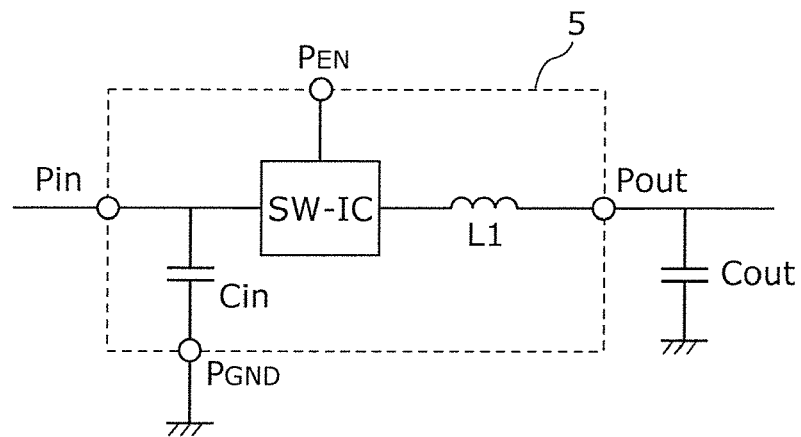
FIG. 14 is a circuit diagram illustrating an example of the electronic component module according to the fifth preferred embodiment of the present invention.

FIG. 14 is a circuit diagram illustrating an example of the electronic component module 5 according to the present preferred embodiment.

As illustrated in FIG. 14, an input terminal of the SW-IC (IC element 20) is connected to an external terminal Pin (first external terminal 14a) on an input side of the electronic component module 5, and an output terminal of the SW-IC is connected to an external terminal Pout (second external terminal 14b) on an output side of the electronic component module 5 with the coil L1 (coil element 12) interposed therebetween. An enable terminal of the SW-IC is connected to an enable terminal PEN (first external terminal 14a) of the electronic component module 5. One end of the capacitor Cin (capacitor 30) on an input side is connected between the external terminal Pin and the input terminal of the SW-IC, and the other end is connected to the ground with a ground terminal PGND (first external terminal 14a) interposed therebetween. Further, one end of the capacitor Cout on an output side is connected to the external terminal Pout located on an output side of the coil L1, and the other end is connected to the ground.

The SW-IC preferably includes, for example, two switch elements, such as a field effect transistor, and a controller exclusively (alternately) switching conducting or non-conducting of the two switch elements (not illustrated). Additionally, the electronic component module 5 switches an input voltage supplied to the external terminal Pin at a predetermined frequency using the two switch elements, converts the input voltage into a desired output voltage and output the desired output voltage from the external terminal Pout.

The SW-IC, the coil L1, the capacitor Cin, and the external terminals Pin, Pout are provided on the substrate 10 so as to have the above connection relationship. Note that the capacitor Cout is provided on a circuit board 101b to be described later.

Hereinafter, each configuration of the electronic component module 5 illustrated in FIGS. 13A and 13B will be described.

As illustrated in FIG. 13A, the substrate 10 has a rectangular or substantially rectangular shape when viewed in plan view, and a dimension of the substrate 10 in the length direction L is equal to or larger than a dimension of the width direction W which is a direction perpendicular or substantially perpendicular to the length direction L. The substrate 10 is preferably, for example, a multilayer substrate formed by laminating and pressure-bonding a plurality of resin base materials. As a material of the resin base material, a thermoplastic resin sheet, such as a liquid crystal polymer (LCP) or a polyimide, is preferably used, for example. The substrate 10 is preferably a non-magnetic body, and the resin base material used to make the substrate 10 has flexibility.

As illustrated in FIG. 13B, the plurality of first surface electrodes 18 connected to the IC element 20, the plurality of second surface electrodes 19 connected to passive components (e.g., capacitor 30), and a second surface electrode 19a connected to the coil element 12 are provided on the one main surface 10a of the substrate 10. Further, the plurality of first external terminals 14a and the second external terminal 14b are provided on the other main surface 10b opposite to the one main surface 10a of the substrate 10. The first external terminal 14a is to mount the electronic component module 5 on a circuit board, such as a printed circuit board, and includes the input terminal Pin inputting a DC voltage, the enable terminal PEN, the ground terminal PGND connected to a ground of the circuit board, and other terminals. The second external terminal 14b is the terminal Pout to output a DC voltage. The second external terminal 14b is disposed at an end portion of both end portions of the substrate 10 in the length direction L, which is located far away from the IC element 20, and is provided at a position overlapping the coil element 12 when viewed in plan view.

As a material for the first surface electrode 18, the second surface electrodes 19 and 19a, and the external terminals 14a and 14b, a metal foil including copper as a main component is preferably used, for example. The first surface electrode 18, the second surface electrodes 19 and 19a, and the external terminals 14a and 14b each have a material property (Young's modulus) harder than a resin base material used to make the substrate 10. For example, nickel, palladium, or gold may preferably be plated on the first surface electrode 18, the second surface electrodes 19 and 19a, and the external terminals 14a and 14b. By the plating, hardness is further increased.

In addition, the via conductor 16 and a lead wire conductor electrically connecting each of the elements are provided inside the substrate 10 (not illustrated in detail). The via conductor is preferably, for example, a metal sintered body including tin as a main component, and the lead wire conductor is preferably made of, for example, a metal foil including copper as a main component.

When the substrate 10 is viewed in plan view (when viewed from a thickness direction), the substrate 10 includes the first region R and the second region F that is a different region from the first region R. The first region R is within a predetermined area in which the plurality of first external terminals 14a, the first surface electrode 18, and the second surface electrodes 19 and 19a are provided. For example, in the length direction L, the first region R is sandwiched between an outermost edge of a terminal (the second surface electrode 19 in the present preferred embodiment) located at one end side of the first external terminal 14a, the first surface electrode 18, and the second surface electrodes 19, 19a, and an outermost edge of a terminal (the second surface electrode 19a in the present preferred embodiment) located at an opposite side of the one end.

The first region R and the second region F of the substrate 10 are adjacent to each other in the length direction L. In addition, in the length direction L, a dimension of the second region F is larger than a dimension of the first region R, and the first region R and the second region F have the same or substantially the same dimension in the width direction W. Further, the first region R and the second region F of the substrate 10 are made of the same resin base material.

In the present preferred embodiment, the plurality of first external terminals 14a, the first surface electrode 18, and the second surface electrodes 19 and 19a are provided in the first region R. With this structure, the first region R is a rigid region (region hard to bend), and the second region F is a region more flexible than the first region R (region easy to bend). Accordingly, when an external force is applied to the second region F of the substrate 10, the second region F is easily bent. In addition, the second external terminal 14b is provided in the second region F. In the second region F, a region in which the second external terminal 14b is provided is more rigid than a region in which the second external terminal 14b is not provided.

The IC element 20 is preferably a semiconductor integrated circuit element in which various circuits are provided on a semiconductor substrate, such as silicon, is molded using an epoxy resin or other suitable material, and has a material property harder than the resin base material from which the substrate 10 is made. The IC element 20 is electrically and mechanically bonded to the substrate 10 with the conductive bonding agent 22, such as solder, for example, and the first surface electrode 18 interposed therebetween. In other words, the IC element 20 is bonded to the first region R of the substrate 10. Since the IC element 20 having the hard property is bonded to the first region R of the substrate 10, the first region R is more rigid than the second region F.

A surface mount passive component is the capacitor 30 which is made of ceramic, for example. The capacitor 30 is preferably, for example, a ceramic capacitor having a rectangular or substantially rectangular parallelepiped shape and is bonded to the substrate 10 with a bonding agent (not illustrated) and the second surface electrode 19 interposed therebetween. Note that the passive component is not limited to a capacitor, and may be an inductor or a resistor, for example.

The coil element 12 is provided inside the substrate 10. As the coil element 12, for example, a flexible metal foil including copper as a main component is preferably used. Further, for example, the coil element is defined by a conductor pattern having a plurality of layers, a plurality of turns and a loop shape in which a coil axis is oriented in a thickness direction of the substrate 10. One end of the coil element 12 is connected to an output terminal on an input side of the IC element 20 with the via conductor 16 in the substrate 10 interposed therebetween, and the other end of the coil element 12 is connected to the second external terminal 14b on an output side located in the second region F with another via conductor (not illustrated) in the substrate 10 interposed therebetween.

When the substrate 10 is viewed in plan view, the coil element 12 extends across the first region R and the second region F. Since the coil element 12 is provided in the first region R and the second region F, a circumferential length of the coil is increased, and an inductance value may be increased accordingly. Thus, as compared to a case in which a coil element is provided only in the first region R, the number of turns in the axial direction of the coil is able to be reduced. Thus, a thickness of the substrate 10 is able to be reduced, and a height of the electronic component module 5 is able to be reduced. Further, by thickening (increasing) a line width of the coil, it is also possible to reduce loss in the coil element.

In addition, a proportion occupied by the coil element 12 in the second region F is larger than a proportion occupied by the coil element 12 in the first region R. That is, in the coil element 12, a portion existing in the second region F is larger than a portion existing in the first region R. With this structure, it is possible to further reduce the number of turns of the coil as compared to the case in which the coil element is provided only in the first region R. Thus, the thickness of the substrate 10 is able to be reduced, and the height of the electronic component module 5 is able to be further reduced. Further, by thickening (increasing) a line width of the coil, it is also possible to reduce loss in the coil element.

Additionally, in order to explain the advantageous effects of the electronic component module 5 according to the present preferred embodiment, a case in which the electronic component module 5 is mounted inside a thin electronic device, such as a personal digital assistant, for example, will be described.

Figure 15:
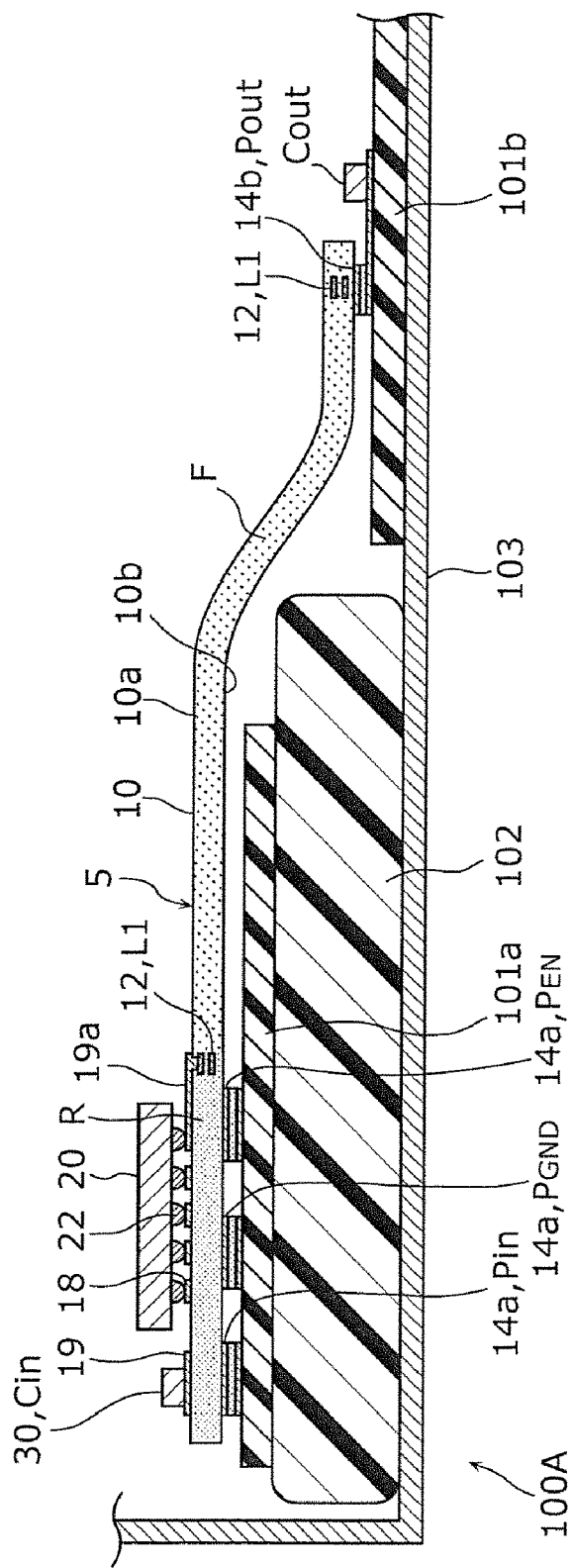
FIG. 15 is a cross-sectional view illustrating a case in which the electronic component module according to the fifth preferred embodiment of the present invention is mounted inside an electronic device.

FIG. 15 is a diagram illustrating a case in which the electronic component module 5 is mounted inside an electronic device 100A. In FIG. 15, circuit boards 101a, 101b, the battery pack 102, and the housing 103 are illustrated as an example of components included in the electronic device 100A. Note that, unlike the substrate 10, each of the circuit boards 101a and 101b is a mother board on which the electronic component module 5 is mounted.

As illustrated in FIG. 15, the electronic component module (DC-DC converter module) 5 is mounted on the circuit board 101a, and the circuit board 101a is mounted on the battery pack 102. The external terminals 14a (input terminal Pin, ground terminal PGND, and enable terminal PEN) of the electronic component module 5 are bonded to the circuit board 101a with a conductive bonding material, such as solder, for example, interposed therebetween. By this bonding, the first region R of the substrate 10 is fixed to the circuit board 101a, and rigidity of the first region R is further improved. Note that the input terminal Pin is connected to a power output terminal of the battery pack 102 with wiring of the circuit board 101a interposed therebetween.

The second region F of the substrate 10 protrudes to an outer side portion (outer side portion as viewed in the length direction L) of the circuit board 101a and is mounted on the circuit board 101b located outside the battery pack 102. Specifically, the second region F is bent along an outer edge of the battery pack 102, and the electronic component module 5 is housed in the housing 103 in this bent state. Then, the external terminal 14b (output terminal Pout) located at an end portion of the second region F is bonded to the circuit board 101b with a conductive bonding material, such as solder, for example, interposed therebetween.

The capacitor Cout is provided on the circuit board 101b. By bonding the output terminal Pout of the electronic component module 5 to the circuit board 101b, the output terminal Pout and the capacitor Cout are connected to each other, thus defining a DC-DC converter.

Further, circuit blocks (RF circuit, monitor drive circuit, central integrated circuit, camera drive circuit, and the like) that require power are provided on the circuit board 101b. Each of the circuit blocks which require power is supplied with predetermined power from the output terminal Pout. In other words, the substrate 10 in the electronic component module 5 defines and functions as a flexible cable that connects the circuit board 101a and the circuit board 101b.

In the electronic component module 5 according to the present preferred embodiment, the first region R of the substrate 10 is the rigid region, and the second region F is the flexible region. Thus, even when components of the electronic device 100A are disposed around the first region R, arrangement of these components is able to be avoided in the second region F, and the electronic component module 5 is able to be mounted at a desired position on the circuit board 101b. Thus, it is possible to reduce limitations on a mounting location when the electronic component module 5 is mounted inside the electronic device 100A. Further, since the limitations on the mounting location are reduced, it is possible to effectively utilize a space in the housing 103 of the electronic device 100A.

While the electronic component modules according to the preferred embodiments of the present invention and the modifications thereof have been described above, the present invention is not limited to the individual preferred embodiments and modifications thereof. Unless departing from the spirit and scope of the present invention, various modifications which those skilled in the art may conceive, applied to the preferred embodiments and the modifications thereof, or preferred embodiments constructed by combining elements in different preferred embodiments and modifications thereof may be included in the scope of one or more aspects of the present invention.

For example, in the first preferred embodiment illustrated in FIGS. 1A to 1C, the second region F is provided on a right side of the first region R as the substrate 10, but the present invention is not limited thereto, and each of the second regions F may be provided on both left and right sides of the first region R.

Further, in the first preferred embodiment, the DC-DC converter is described as an example of the electronic component module 1, but the DC-DC converter may be a step-down converter or a step-up converter, for example.

Electronic component modules according to preferred embodiments of the present invention may be widely used as components of electronic devices, such as personal digital assistants or wearable terminals, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An electronic component module, comprising:
a substrate;
a coil element provided in or on the substrate; and
an IC element connected to the coil element; wherein
a plurality of external terminals are provided on the substrate;
the substrate includes a first region and a second region different from the first region when the substrate is viewed in plan view;
the IC element is provided in the first region;

the plurality of external terminals are provided at least in the first region;
the coil element extends across the first region and the second region;
the first region is a rigid region and the second region is more flexible than the first region;
the coil element includes a conductor pattern having at least one of a loop shape and a spiral shape; and
a portion of the conductor pattern having the at least one of the loop shape and the spiral shape is provided in the first region.

2. The electronic component module according to claim 1, wherein
when the substrate is viewed in plan view, a dimension of the substrate in a length direction is equal to or larger than a dimension of the substrate in a width direction perpendicular or substantially perpendicular to the length direction; and
the first region and the second region are adjacent to each other in the length direction.

3. The electronic component module according to claim 1, wherein a proportion of the coil element to the second region is larger than a proportion of the coil element to the first region.

4. The electronic component module according to claim 1, wherein
the first region is bonded to a circuit board different from the substrate with the plurality of external terminals interposed therebetween; and
an end portion of the second region of both ends of the substrate is a free end.

5. The electronic component module according to claim 1, wherein at least a portion of the second region has a curved shape.

6. The electronic component module according to claim 1, wherein
a plurality of surface mount passive components are provided on the substrate; and
the plurality of passive components are provided in a vicinity of a boundary between the first region and the second region.

7. The electronic component module according to claim 6, wherein
a plurality of first surface electrodes connected to the IC element and a plurality of second surface electrodes connected to the plurality of passive components are provided on a surface of the substrate opposite to a surface of the substrate on which the plurality of external terminals are provided;
the plurality of first surface electrodes are provided in the first region of the substrate;
the plurality of second surface electrodes are provided at least in the second region of the substrate; and
a proportion of an area of the first surface electrodes to the first region is larger than a proportion of an area of the second surface electrodes to the second region.

8. A DC-DC converter comprising an electronic component module including a substrate, a coil element provided in or on the substrate, and an IC element connected to the coil element; wherein
a plurality of external terminals are provided on the substrate;
the substrate includes a first region and a second region different from the first region when the substrate is viewed in plan view;
the IC element is provided in the first region;
the plurality of external terminals are provided at least in the first region;
the coil element extends across the first region and the second region;
the first region is a rigid region, and the second region is more flexible than the first region;
the coil element includes a conductor pattern having at least one of a loop shape and a spiral shape; and
a portion of the conductor pattern having the at least one of the loop shape and the spiral shape is provided in the first region.

9. The DC-DC converter according to claim 8, wherein
when the substrate is viewed in plan view, a dimension of the substrate in a length direction is equal to or larger than a dimension of the substrate in a width direction perpendicular or substantially perpendicular to the length direction; and
the first region and the second region are adjacent to each other in the length direction.

10. The DC-DC converter according to claim 8, wherein a proportion of the coil element to the second region is larger than a proportion of the coil element to the first region.

11. The DC-DC converter according to claim 8, wherein
the first region is bonded to a circuit board different from the substrate with the plurality of external terminals interposed therebetween; and
an end portion of the second region of both ends of the substrate is a free end.

12. The DC-DC converter according to claim 8, wherein at least a portion of the second region has a curved shape.

13. The DC-DC converter according to claim 8, wherein
a plurality of surface mount passive components are provided on the substrate; and
the plurality of passive components are provided in a vicinity of a boundary between the first region and the second region.

14. The DC-DC converter according to claim 13, wherein
a plurality of first surface electrodes connected to the IC element and a plurality of second surface electrodes connected to the plurality of passive components are provided on a surface of the substrate opposite to a surface of the substrate on which the plurality of external terminals are provided;
the plurality of first surface electrodes are provided in the first region of the substrate;
the plurality of second surface electrodes are provided at least in the second region of the substrate; and
a proportion of an area of the first surface electrodes to the first region is larger than a proportion of an area of the second surface electrodes to the second region.

15. An electronic device comprising:
an electronic component module including a substrate, a coil element provided in or on the substrate, and an IC element connected to the coil element;
a circuit board on which the electronic component module is mounted; and
a housing in which the electronic component module and the circuit board are housed; wherein
a plurality of external terminals are provided on the substrate of the electronic component module, the substrate includes a first region and a second region different from the first region when the substrate is viewed in plan view, the IC element is provided in the first region, the plurality of external terminals are provided at least in the first region, the coil element extends across the first region and the second region, and the first region is a rigid region and the second region is more flexible than the first region; and the coil element includes a conductor pattern having at least one of a loop shape and a spiral shape, and a portion of the conductor pattern having the at least one of the loop shape and the spiral shape is provided in the first region.

16. The electronic device according to claim 15, wherein the first region of the substrate of the electronic component module is fixed on the circuit board, and the second region of the substrate is housed in the housing in a state of being bent.

17. The electronic device according to claim 15, wherein when the substrate is viewed in plan view, a dimension of the substrate in a length direction is equal to or larger than a dimension of the substrate in a width direction perpendicular or substantially perpendicular to the length direction; and the first region and the second region are adjacent to each other in the length direction.

18. The electronic device according to claim 15, wherein a proportion of the coil element to the second region is larger than a proportion of the coil element to the first region.

19. The electronic device according to claim 15, wherein a plurality of surface mount passive components are provided on the substrate; and the plurality of passive components are provided in a vicinity of a boundary between the first region and the second region.

20. The electronic device according to claim 19, wherein a plurality of first surface electrodes connected to the IC element and a plurality of second surface electrodes connected to the plurality of passive components are provided on a surface of the substrate opposite to a surface of the substrate on which the plurality of external terminals are provided;

the plurality of first surface electrodes are provided in the first region of the substrate;

the plurality of second surface electrodes are provided at least in the second region of the substrate; and a proportion of an area of the first surface electrodes to the first region is larger than a proportion of an area of the second surface electrodes to the second region.

* * * * *